United States Patent
Alini et al.

(10) Patent No.: US 7,292,066 B2
(45) Date of Patent: Nov. 6, 2007

(54) ONE-TIME PROGRAMMABLE CIRCUIT EXPLOITING BJT $H_{FE}$ DEGRADATION

(75) Inventors: Roberto Alini, Dublin, CA (US);
Sergio Stefano Rovati, Milan (IT);
Eric Vandenbossche, Glendale, AZ (US); Christopher Paskins, Laueen, AZ (US)

(73) Assignees: STMicroelectronics, Inc., Carrollton, TX (US); STMicroelectronics S.A. (FR); STMicroelectronics SRL (IT)

( * ) Notice: Subject to any disclaimer, the term of this patent is extended or adjusted under 35 U.S.C. 154(b) by 255 days.

(21) Appl. No.: 11/115,538

(22) Filed: Apr. 27, 2005

(65) Prior Publication Data

US 2006/0262590 A1    Nov. 23, 2006

(51) Int. Cl.
*H03K 19/082* (2006.01)

(52) U.S. Cl. ............................ 326/48; 326/37; 365/96; 365/104

(58) Field of Classification Search ............... 326/16, 326/37, 38, 48; 365/96, 104, 177
See application file for complete search history.

(56) References Cited

U.S. PATENT DOCUMENTS

| | | | |
|---|---|---|---|
| 3,733,690 A | * | 5/1973 | Rizzi et al. ............ 438/130 |
| 3,742,592 A | | 7/1973 | Rizzi et al. |
| 4,703,455 A | | 10/1987 | Bynum |
| 5,625,205 A | | 4/1997 | Kusma |

* cited by examiner

*Primary Examiner*—Daniel D. Chang
(74) *Attorney, Agent, or Firm*—Lisa K. Jorgenson; William J. Kubida (57) ABSTRACT

A one-time programmable circuit uses forced BJT $h_{FE}$ degradation to permanently store digital information as a logic zero or logic one state. The forced degradation is accomplished by applying a voltage or current to the BJT for a specific time to the reversed biased base-emitter junction, allowing a significant degradation of the junction without destroying it.

21 Claims, 6 Drawing Sheets

SINGLE FUSE CASE

SINGLE FUSE CASE

Fig. 9
MULTI FUSE CASE

ONE-TIME PROGRAMMABLE CIRCUIT EXPLOITING BJT $H_{FE}$ DEGRADATION

BACKGROUND OF THE INVENTION

One-time programmable ("OTP") circuits are widely used in many types of integrated circuits such as analog, digital, or mixed signal integrated circuits. They are used to precisely trim bias circuits such as bandgap reference circuits, generic internal voltage circuits or current references, as well as controlling other generic circuit parameters such as offset, gain, delay, and the like.

Typical OTP circuits include polysilicon fuse based circuits used with or without a separate pad for blowing the fuse using external components, metal fuse based circuits, circuits that use the complete breakdown of the base-emitter junction of an NPN bipolar transistor (bipolar junction transistor or "BJT"), circuits that use the breakdown of a thin-oxide layer, as well as EEPROM fuse cell based circuits.

The disadvantages of these circuits include large integrated circuit layout area as well as high fuse blowing currents (polysilicon and metal fuse based circuits) or high fuse blowing voltages (thin oxide and EEPROM based circuits). Additional disadvantages include one or two additional mask layers that are not normally used, resulting in additional manufacturing cost.

Polysilicon based circuits therefore need high currents for fuse blowing, and need a dedicated pad or a large MOS switch to blow the fuse. The fuse must be blown rapidly (within 10 to 100 ns) or it may easily fail to blow or recombine. Polysilicon based circuits need redundancy because of possible recombination, and may need many additional circuits for testing the overall quality of the fuse blowing.

Metal fuse based circuits also need high currents for fuse blowing, and also need a dedicated pad or large MOS switch for blowing the fuse. The fuse blowing must also be done rapidly or the fuse may fail to blow or will recombine. Redundant fuses are usually used with metal fuse based circuits. Additionally, metal fuses are not preferred because these fuses may destroy the oxide layer above the fuse by opening a hole in the oxide layer.

NPN bipolar transistor based circuits need a medium to high current for blowing the fuse, which is dependent upon the process used. However, a considerably high voltage is needed to blow the fuse, which is also process dependent. These types of circuits are usually preferred over polysilicon and metal based fuse blowing circuits.

EEPROM based circuits need a high voltage in order to trap charge on an MOS gate. One or two additional mask layers are needed, which adds unnecessary expense.

Thin oxide breakdown based circuits need high voltages to blow the fuse and usually take a relatively large integrated circuit die area, which also adds unnecessary expense.

What is desired, therefore, is an OTP circuit that is smaller than the prior art circuits mentioned above, that uses small fuse blowing currents and voltages, and is available in a standard BiCMOS process technology.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

SUMMARY OF THE INVENTION

According to an embodiment of the present invention, an OTP circuit uses $h_{FE}$ degradation in an NPN bipolar transistor. The degradation is only partial, and does not completely destroy the base-emitter junction of the transistor or harm the surrounding integrated circuit die area as in prior art OTP or fuse blowing circuits. The OTP circuit of the present invention is very small compared to prior art circuits, uses a small fuse blowing current on the order of 20 μA and a small fuse blowing voltage on the order of four volts or less. The circuit of the present invention can be designed in a 0.35 μm CMOS, SiGe bipolar technology, although other types of process technologies including an NPN bipolar transistor can be used. The desirable small fuse cell area is provided without using additional masks.

In a multiple fuse embodiment, the fuse blowing is done in parallel for all cells. There is no need for a special pad or special high voltage component or a large MOS switch to effectuate the fuse blowing. There is no damage done to the integrated circuit die area surrounding the fuse since no physical damage is done to the NPN transistor; there is only a permanent degradation of the $h_{FE}$ of the transistor. Additionally, there is no possibility of recombination or recovery as in the prior art circuits mentioned above.

The OTP functionality of the circuit can be used to provide useful wafer information such as lot number, wafer number, and chip position in the wafer using only 20 to 30 bits of information, giving extremely useful information regarding traceability; this is particularly useful for bare die products.

DETAILED DESCRIPTION

The conditions for fuse blowing are established in the present invention by reverse biasing the base-emitter junction of an NPN bipolar transistor under specific voltage, current, and time constraints. Reverse biasing the base-emitter junction activates traps at the interface between silicon and silicon dioxide between the base and emitter contacts.

Figure 1:
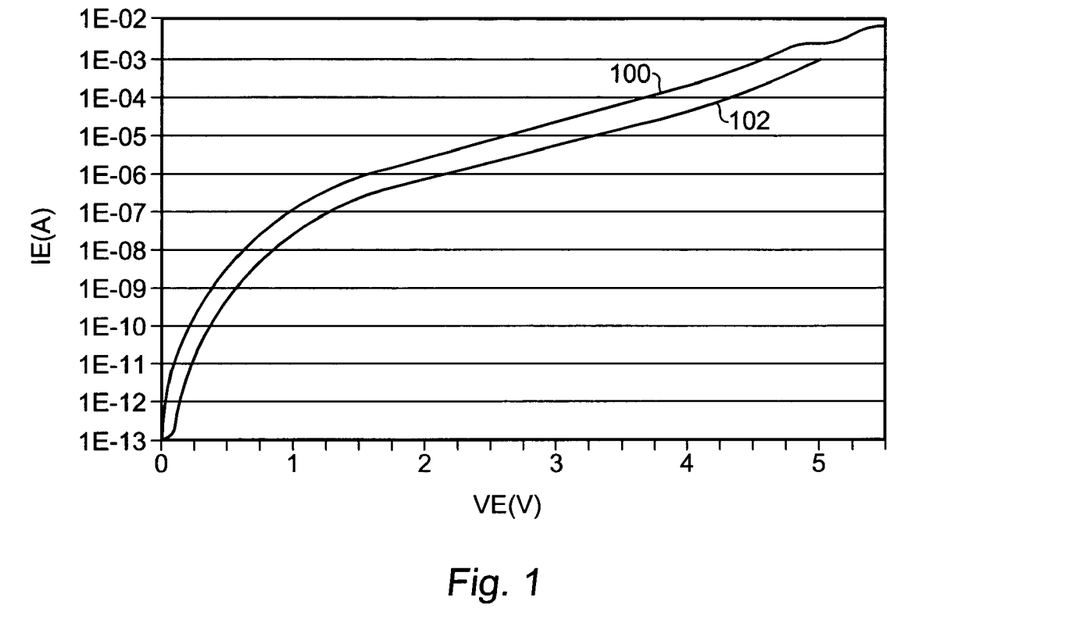
FIG. 1 is a plot of the current and voltage used to reverse bias and degrade the $h_{FE}$ of an NPN bipolar transistor to be used as the fuse element in an OTP circuit according to an embodiment of the present invention.

Referring now to FIG. 1, a plot of the current and voltage used to reverse bias and degrade the $h_{FE}$ of an NPN bipolar transistor to be used as the fuse element in an OTP circuit is shown according to an embodiment of the present invention. In FIG. 1 the collector, base, and substrate voltages are all set to ground potential. In FIG. 1, trace 100 is a plot of the reverse bias current versus voltage for an NPN bipolar transistor having an emitter size of 0.4×0.8 µm². Trace 102 is a plot of the reverse bias current versus voltage for an NPN bipolar transistor having an emitter size of 0.4×12.8 µm².

Figure 2:
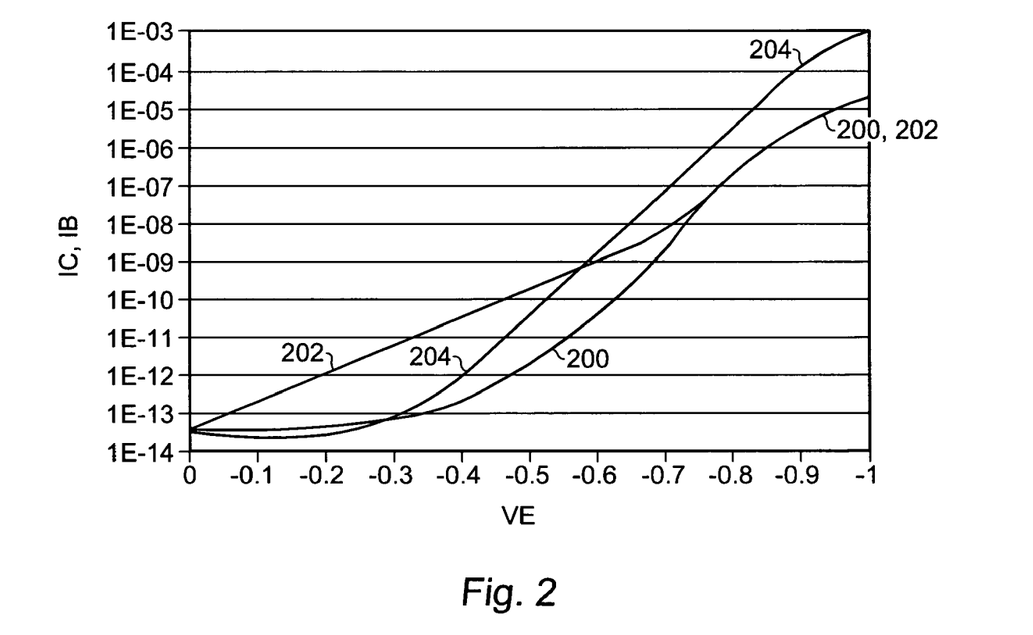
FIG. 2 is a current-voltage plot of collector and base currents of an NPN bipolar transistor before and after $h_{FE}$ degradation according to the present invention.

Referring now to FIG. 2, a current-voltage plot of collector and base currents of an NPN bipolar transistor before and after $h_{FE}$ degradation according to the present invention are shown. FIG. 2 is a Gummel plot of the collector and base currents of an NPN bipolar transistor having an emitter area of 0.4×0.8 µm². Note that base current is strongly affected by the stress of reverse biasing the emitter-base junction. Trace 200 is the base current curve before stress, and trace 202 is the base current curve after stress. The collector current is substantially unaffected, and so the pre-stress and post-stress collector curves are represented by a single trace 204.

Degradation of $h_{FE}$ has been performed on an NPN bipolar transistor having an emitter size of 0.4×0.8 µm². The stress condition used to reverse bias the base-emitter junction is VBE of −4 volts, an emitter current of 20 nA, and a duration for the stress conditions of 30 milliseconds. The reading conditions for detecting the $h_{FE}$ degradation were a VBE of 669 millivolts and a collector current of 100 nA. Under the conditions set forth above an 81.3% degradation of $h_{FE}$ was observed. A very high level of degradation as set forth above is desirable for operation of the sensing circuits surrounding the fuse element. The $h_{FE}$ degradation established above should be stable in time. It has been demonstrated that the $h_{FE}$ degradation does not recover in time. This is explained further below with respect to FIG. 7.

Figure 3:
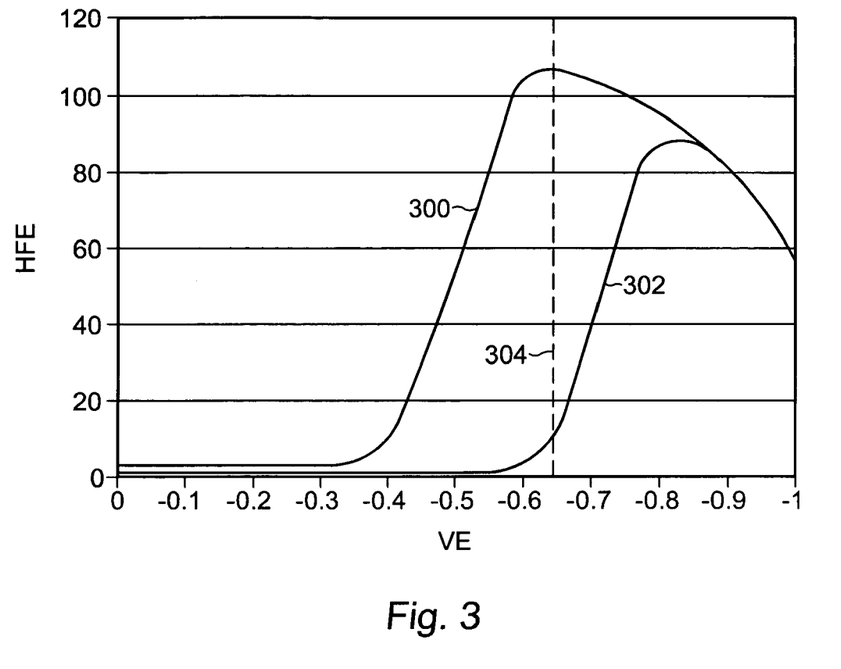
FIG. 3 is a plot of $h_{FE}$ versus emitter voltage with the base grounded before and after $h_{FE}$ degradation according to the present invention.

Referring now to FIG. 3, a plot of $h_{FE}$ versus voltage before and after $h_{FE}$ degradation is shown according to the present invention. In FIG. 3, trace 300 is the $h_{FE}$ curve versus voltage before the reverse-bias stress has been applied. Note that the peak of the $h_{FE}$ curve occurs at about −0.64 volts as highlighted by vertical line 304. Trace 302 is the $h_{FE}$ curve versus voltage after the reverse-bias stress has been applied. Note that the peak is significantly lower at −0.64 volts.

Figure 4:
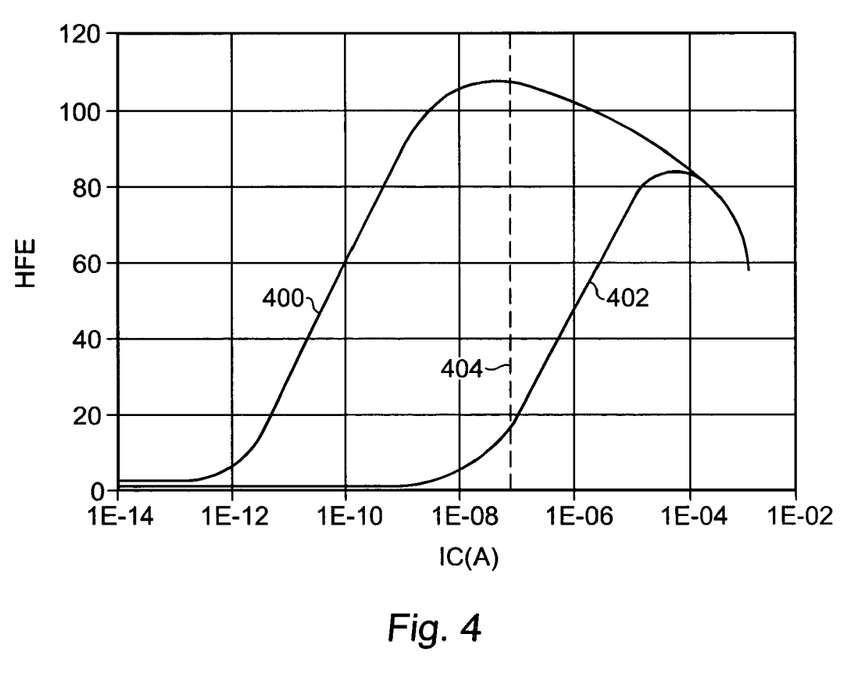
FIG. 4 is a plot of $h_{FE}$ versus current before and after $h_{FE}$ degradation according to the present invention.

Referring now to FIG. 4, a plot of $h_{FE}$ versus current before and after $h_{FE}$ degradation is shown according to the present invention. In FIG. 4, trace 400 is the $h_{FE}$ curve versus current before the reverse-bias stress has been applied. Note that the peak of the $h_{FE}$ curve occurs at about 0.1 µA as highlighted by vertical line 404. Trace 402 is the $h_{FE}$ curve versus current after the reverse-bias stress has been applied. Note that the peak is significantly lower at 0.1 µA.

Figure 5:
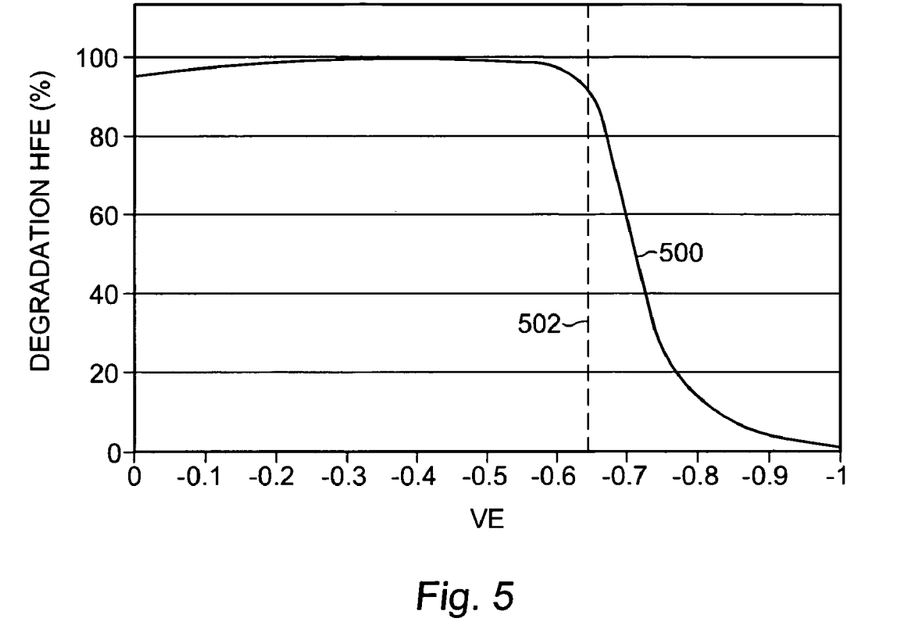
FIG. 5 is a plot of $h_{FE}$ degradation versus reverse bias emitter-base voltage according to the present invention.

Referring now to FIG. 5, a plot 500 of $h_{FE}$ degradation versus base-emitter voltage ($V_{Eb}$) is shown. A negative $V_{EB}$ is a positive $V_{BE}$, which means an NPN transistor is in the normal mode of operation, and not reverse biased. At low $V_{BE}$, $h_{FE}$ is significantly degraded (approaching or at 100%). Above 0.65 volts, $h_{FE}$ shows less degradation. The NPN fuse should be used at voltages on the left side of vertical line 502 where $h_{FE}$ degradation is very high.

Figure 6:
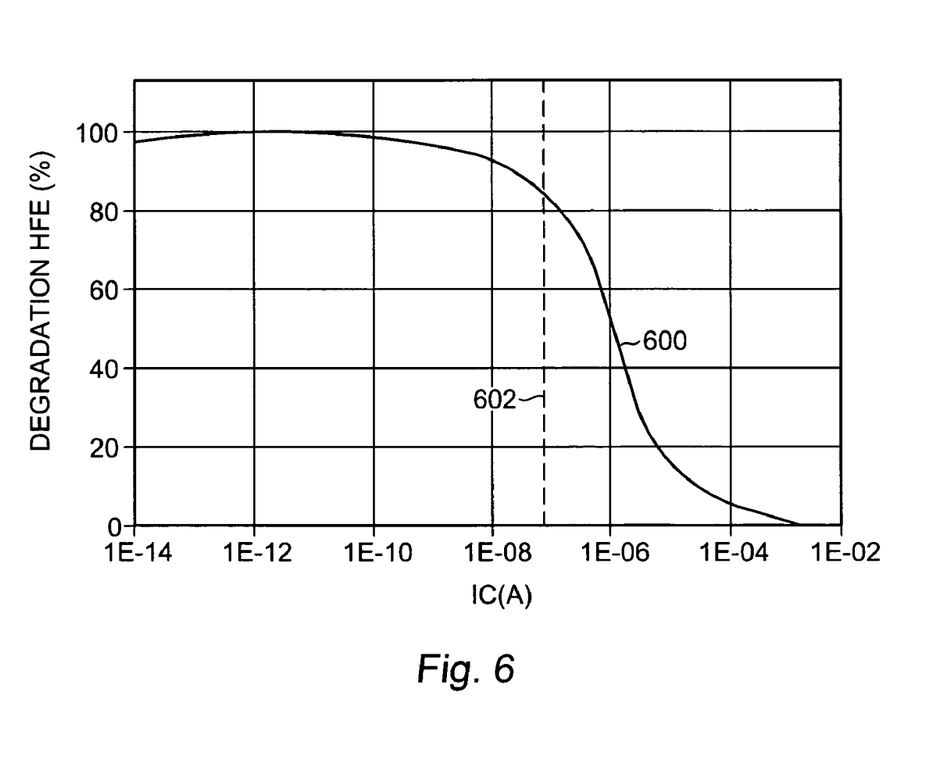
FIG. 6 is a plot of $h_{FE}$ degradation versus reverse bias emitter current according to the present invention.

Referring now to FIG. 6, a plot 600 of $h_{FE}$ degradation versus reverse bias emitter current is shown. At low collector currents, $h_{FE}$ is significantly degraded (approaching or at 100%). Above 0.1 µA, $h_{FE}$ shows less degradation. The NPN fuse should be used at currents on the left side of vertical line 602 where $h_{FE}$ degradation is very high.

Figure 7:
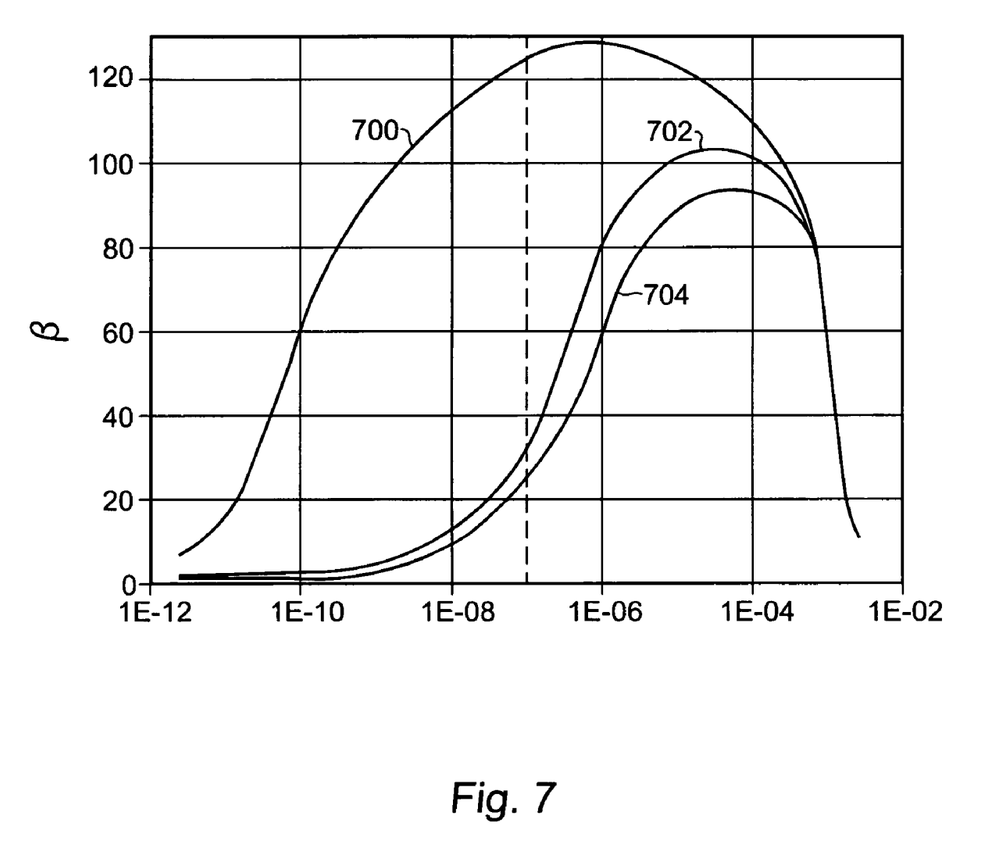
FIG. 7 is a plot of $h_{FE}$ versus current for press-stress $h_{FE}$, post-stress $h_{FE}$, and post-stress $h_{FE}$ after 168 hours of baking time according to the present invention.

Referring now to FIG. 7, a plot of $h_{FE}$ versus collector current for press-stress $h_{FE}$, post-stress $h_{FE}$, and post-stress $h_{FE}$ after 168 hours of baking time is shown. Trace 700 shows the pre-stress $h_{FE}$. Trace 702 shows the post-stress $h_{FE}$. Note that the post-stress $h_{FE}$ curve 704 is significantly smaller than the pre-stress $h_{FE}$ curve over a wide range of current values. Trace 702 shows the post-stress $h_{FE}$ curve after 168 hours of baking at 250° C. Note that the $h_{FE}$ curve rebounds only slightly, but is still significantly smaller than the pre-stress $h_{FE}$ curve 700 over a wide range of current values.

Figure 8:
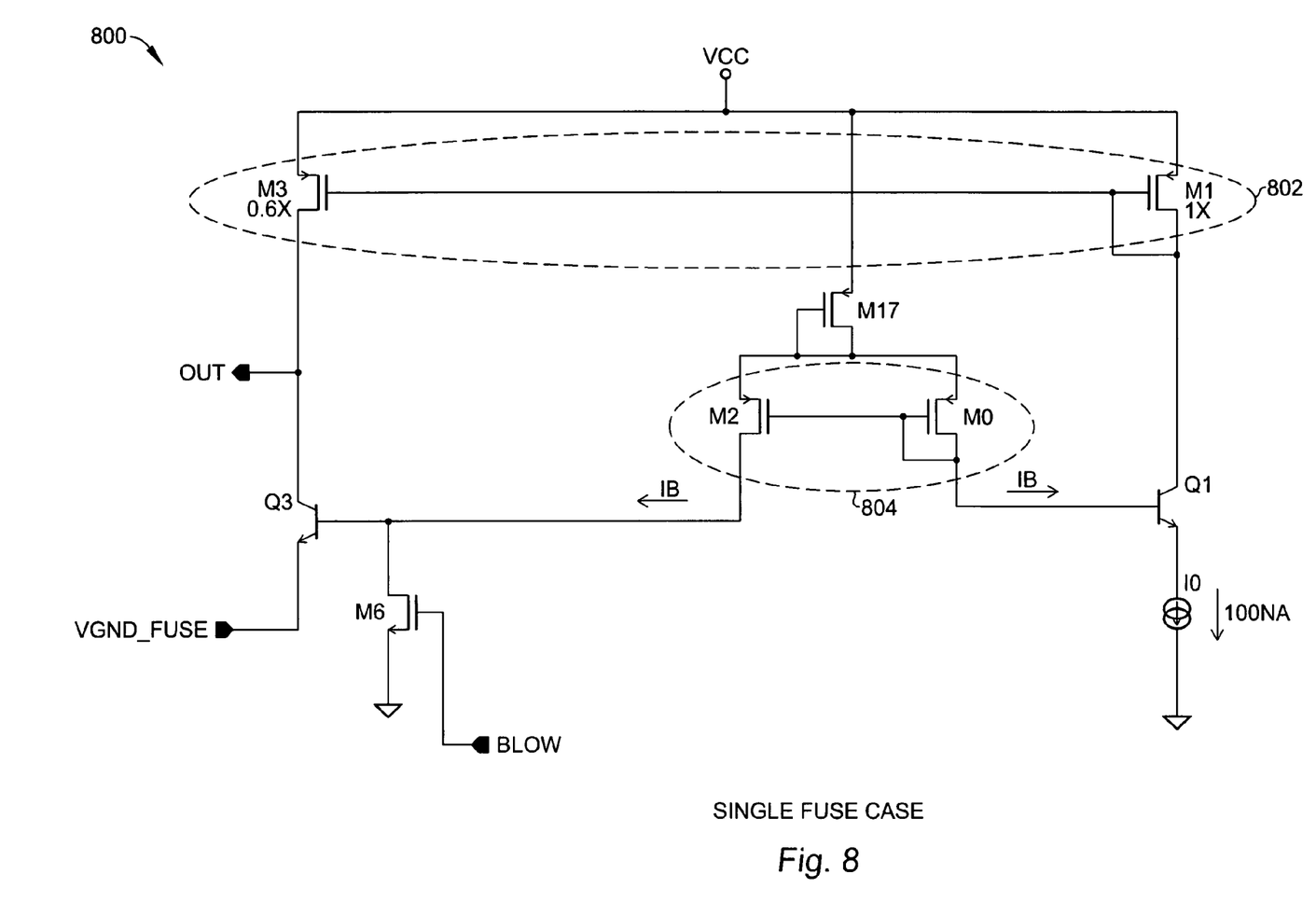
FIG. 8 is a circuit diagram of an OTP circuit using a single fuse according to an embodiment of the present invention.

Referring now to FIG. 8 a circuit diagram of an OTP circuit 800 using a single fuse (transistor Q3) according to an embodiment of the present invention is shown. Before $h_{FE}$ degradation, NPN bipolar transistors Q1 and Q3 have the same nominal $h_{FE}$ value. Since transistors Q1 and Q3 are driven by the same base current through current mirror 804, and since current mirror 802 is unbalanced, the output voltage at the OUT node is a logic zero. To program the output at the OUT node to a permanent logic one value, the BLOW node ("blow pin") is set to a logic one value (such as 3.3 volts), which ground the base of transistor Q3. Simultaneously, the emitter of transistor Q3 (VGND_FUSE) is raised to 3.5-4 volts for 20-30 milliseconds. Transistor Q3 has a reverse-biased emitter-base junction of about 3.5-4 volts and its $h_{FE}$ degrades from a nominal value of about 110 as shown in FIG. 4 to 0.15 times the nominal value to about 17 as is also shown in FIG. 4.

Circuit 800 shown in FIG. 8 is but one of many such circuits that can be designed for a single fuse case as is known by those skilled in the art. For a single fuse case all that is required is a node for reverse biasing the emitter of an NPN bipolar transistor, and a sensing circuit to sense the value of $h_{FE}$ before and after degradation, and an ability to provide a logic value corresponding to whether or not the $h_{FE}$ value has been degraded.

Figure 9:
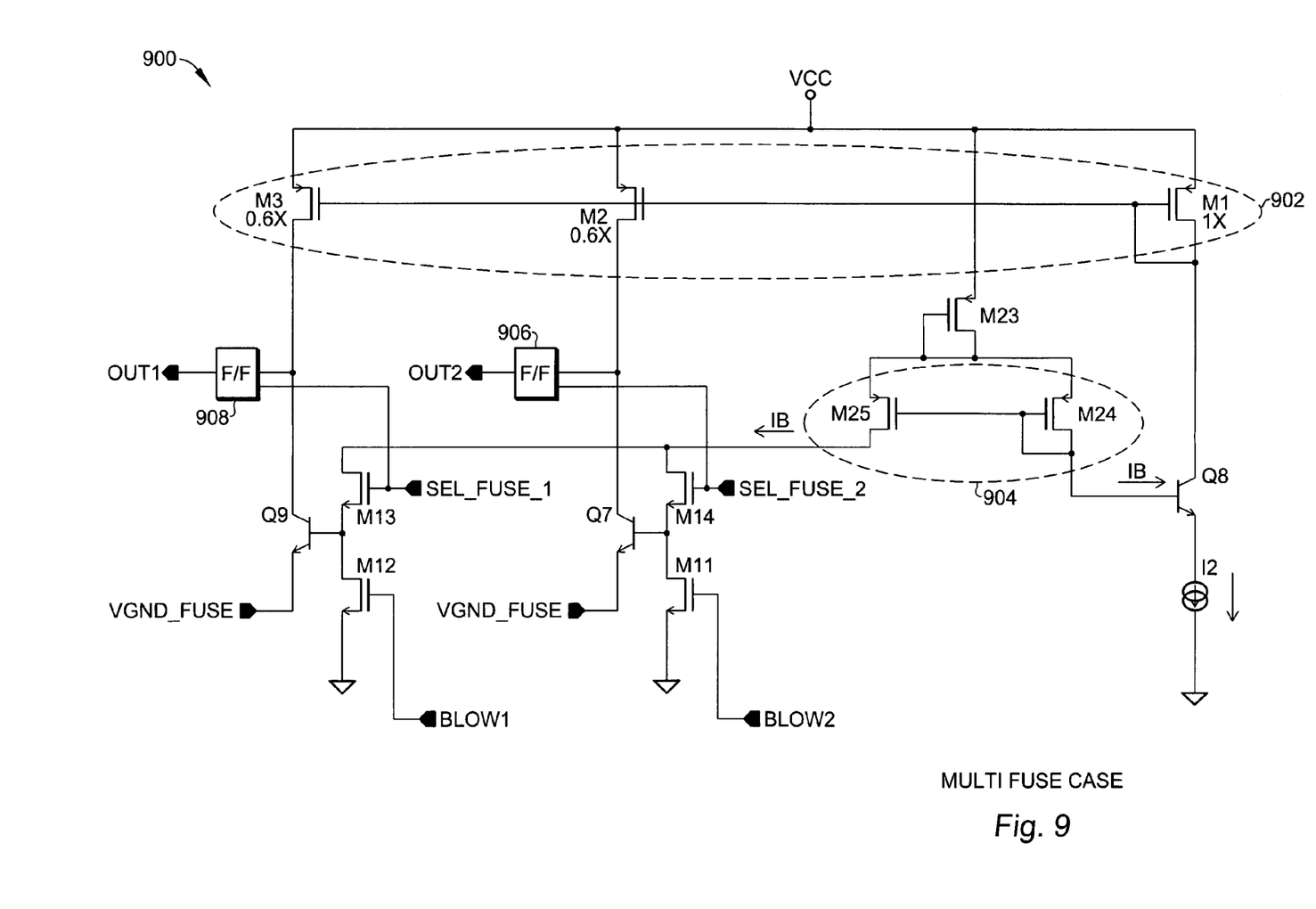
FIG. 9 is a circuit diagram of an OTP circuit using multiple fuses according to an embodiment of the present invention.

Referring now to FIG. 9, a circuit diagram of an OTP circuit 900 using multiple fuses according to an embodiment of the present invention is shown. While two fuses (transistors Q7 and Q9) are shown, the concepts embodied in circuit 900 can be extended to any number of fuses desired. In circuit 900 the base current of transistor Q8 is copied once using current mirror 904. Only one NPN bipolar transistor branch can be selected at a time. For this reason, the various outputs of the fuses (OUT1, OUT2) are latched by flip-flops 906 and 908 once they are selected through control signals SEL_FUSE_1 and SEL_FUSE_2. The actual digital control circuitry for the control signals is not shown in FIG. 9.

In circuit 900, before any $h_{FE}$ degradation, all of the NPN transistors Q9, Q7, and Q8 have the same nominal value of $h_{FE}$. Since these transistors are driven by the same base current through current mirror 904, and since current mirror 902 is unbalanced, the various outputs OUT1 and OUT2 are set to a logic zero value. Note that transistors M3 and M2 are only 0.6 the size of transistor M1 and thus deliver less current than provided by the current reference I2.

To program an output to a logic one, either BLOW1 or BLOW2 is set to a logical one value to ground the base of the selected transistor, and the common VGND_FUSE pin is set to 3.5-4 volts for 20-30 milliseconds. Since this is a common pin, all of the transistor emitters will rise to this voltage level. However, it is important to note that only the selected transistor having a grounded base through the action of the blow pin will have a degraded value of $h_{FE}$. The $h_{FE}$ values change in a similar manner as described above with respect to single fuse circuit 800.

Circuit 900 shown in FIG. 9 is but one of many such circuits that can be designed for a multiple fuse case as is known by those skilled in the art. For a multiple fuse case all that is required is a node for applying a voltage to the emitter of the NPN bipolar transistors, control signals for grounding the bases of selected transistors, a sensing circuit to sense the value of $h_{FE}$ before and after degradation, and an ability to provide a logic value corresponding to whether or not the $h_{FE}$ value has been degraded.

Those skilled in the art will understand that the present invention works with a wide range of different high speed, low voltage integrated circuit process technologies that include a bipolar NPN transistor. The exact voltage/current/time profile for degrading the $h_{FE}$ of the fuse transistor may have to be slightly adjusted to provide an optimum amount of degradation as required by the exact process and circuit implementation used. The minimum allowed emitter size for the fuse transistor will be ordinarily used to minimize layout and therefore integrated circuit die area, although larger emitter sizes can used if desired. The four volt case described above is particularly valid for a proprietary BiCMOS process technology using Si—Ge transistors used by the assignee of the present invention. This voltage value may change for another high speed, low voltage process technology but not dramatically so. Reverse bias voltages are likely to be in the range between two and five volts. What is important for determining the exact voltage is that inside the structure of the NPN fuse transistor, by reversing the emitter-base junction according to the present invention, traps are activated at the silicon/silicon dioxide interface between the base and the emitter contacts that degrade the $h_{FE}$ of the transistor.

While there have been described above the principles of the present invention in conjunction with specific memory architectures and methods of operation, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

We claim:

1. A method of providing an output signal comprising:
   providing a first bipolar transistor having a nominal $h_{FE}$;
   providing a second bipolar transistor having a nominal $h_{FE}$;
   providing a first current mirror having a input coupled to a base of the first bipolar transistor and an outputed coupled to a base of the second bipolar transistor;
   providing a second current mirror having an input coupled to a collector of the first bipolar transistor and an output coupled to a collector of the second bipolar transistor;
   providing an output signal at the output of the second current mirror; and
   optionally degrading the $h_{FE}$ of the second bipolar transistor to change the output signal from a first state to a second state.

2. The method of claim 1 wherein the second state of the output signal is permanent.

3. The method of claim 1 wherein the first and second states of the output signal comprise digital logic states.

4. The method of claim 1 wherein providing a first bipolar transistor and providing a second bipolar transistor comprises providing an NPN bipolar transistor.

5. The method of claim 1 wherein the $h_{FE}$ of the second bipolar transistor is degraded by generating a negative $V_{BE}$ for a predetermined length of time.

6. The method of claim 5 wherein the negative $V_{BE}$ is obtained by the application of a voltage to the emitter of the second bipolar transistor.

7. The method of claim 5 wherein the negative VBE is obtained by the application of a current to the emitter of the second bipolar transistor.

8. The method of claim 5 wherein the absolute value of the negative VBE is about two to five volts.

9. The method of claim 5 wherein the predetermined length of time is about 20 to 30 milliseconds.

10. The method of claim 5 wherein the $h_{FE}$ is degraded in excess of 80%.

11. A circuit for providing an output signal comprising:
    a first bipolar transistor having a nominal $h_{FE}$;
    a second bipolar transistor having a nominal $h_{FE}$;
    a first current mirror having an input coupled to a base of the first bipolar transistor and an output coupled to a base of the second bipolar transistor;
    a second current mirror having an input coupled to a collector of the first bipolar transistor and an output coupled to a collector of the second bipolar transistor;
    an output signal at the output of the second current mirror; and
    circuitry for optionally degrading the $h_{FE}$ of the second bipolar transistor to change the output signal from a first state to a second state.

12. The circuit of claim 11 wherein the second state of the output signal is permanent.

13. The circuit of claim 11 wherein the first and second states of the output signal comprise digital logic states.

14. The circuit of claim 11 wherein the first bipolar transistor and the second bipolar transistor each comprise an NPN bipolar transistor.

15. The circuit of claim 11 wherein the $h_{FE}$ of the second bipolar transistor is degraded by generating a negative $V_{BE}$ for a predetermined length of time.

16. The circuit of claim 15 wherein the negative $V_{BE}$ is obtained by the application of a voltage to the emitter of the second bipolar transistor.

17. The circuit of claim 15 wherein the negative VBE is obtained by the application of a current to the emitter of the second bipolar transistor.

18. The circuit of claim 15 wherein the absolute value of the negative VBE is about two to five volts.

19. The circuit of claim 15 wherein the predetermined length of time is about 20 to 30 milliseconds.

20. The circuit of claim 15 wherein the $h_{FE}$ is degraded in excess of 80%.

21. A one time programmable circuit for providing a plurality of digital output signals comprising:
- a plurality of bipolar transistors each having a nominal $h_{FE}$ including a first bipolar transistor and a plurality of bipolar transistors;
- a first current mirror having an inputs coupled to a base of each of the first bipolar transistor and a plurality of outputs coupled to a base of the remaining bipolar transistors;
- a second current mirror having an input coupled to a collector of the first bipolar transistors and a plurality of outputs coupled to a collector of each of the remaining bipolar transistors;
- a plurality of output signals at the outputs of the second current mirror; and
- circuitry for selectively degrading the $h_{FE}$ of the remaining bipolar transistors to change the corresponding output signals from a permanent first logic state to a permanent second logic state.

* * * * *

UNITED STATES PATENT AND TRADEMARK OFFICE
CERTIFICATE OF CORRECTION

PATENT NO. : 7,292,066 B2 Page 1 of 1
APPLICATION NO. : 11/115538
DATED : November 6, 2007
INVENTOR(S) : Roberto Alini et al.

It is certified that error appears in the above-identified patent and that said Letters Patent is hereby corrected as shown below:

column 3, line 29, "nA" should be --µA-- column 4, line 23, delete "the same" and insert --equal-- column 4, line 23, "current" should be --currents-- column 6, line 1, "a" should be --an-- column 6, line 2, "outputed" should be --output-- column 7, line 6, after "a" insert --remaining-- column 7, line 8, "inputs" should be --input-- column 7, line 9, delete "each"

column 7, line 10, after "base of" insert --each of-- column 8, line 2, "transistors" should be --transistor--

Signed and Sealed this

Sixth Day of May, 2008

JON W. DUDAS
*Director of the United States Patent and Trademark Office*